United States Patent [19]

Anderson

[11] 4,056,815

[45] Nov. 1, 1977

[54] BATTERY OPERATED TRANSMITTER CIRCUIT

[75] Inventor: Arthur Ernest Anderson, Franklin, Pa.

[73] Assignee: Westinghouse Electric Corporation, Pittsburgh, Pa.

[21] Appl. No.: 655,036

[22] Filed: Feb. 3, 1976

[51] Int. Cl.² .................. G08B 21/00; G08B 29/00; G08B 1/00
[52] U.S. Cl. ................................. 340/224; 340/411
[58] Field of Search .......................... 340/224, 411

[56] References Cited

U.S. PATENT DOCUMENTS

| | | | |
|---|---|---|---|
| 1,497,194 | 6/1924 | Norden et al. | 340/224 |
| 3,441,858 | 4/1969 | Grahan | 340/224 |
| 3,848,231 | 11/1974 | Wootton | 340/224 |
| 3,882,476 | 5/1975 | Löfgren | 340/411 |

*Primary Examiner*—Glen R. Swann, III
*Attorney, Agent, or Firm*—M. P. Lynch

[57] ABSTRACT

A battery operated code producing wireless RF alarm detection circuit is designed to continuously monitor the condition of the battery and periodically determine the operational integrity of the detection circuit as well as communicate distinct codes indicative of the operational integrity of the detection circuit and alarm conditions. A local receiver circuit responds to the RF transmitted codes from one or more alarm detection circuits.

4 Claims, 6 Drawing Figures

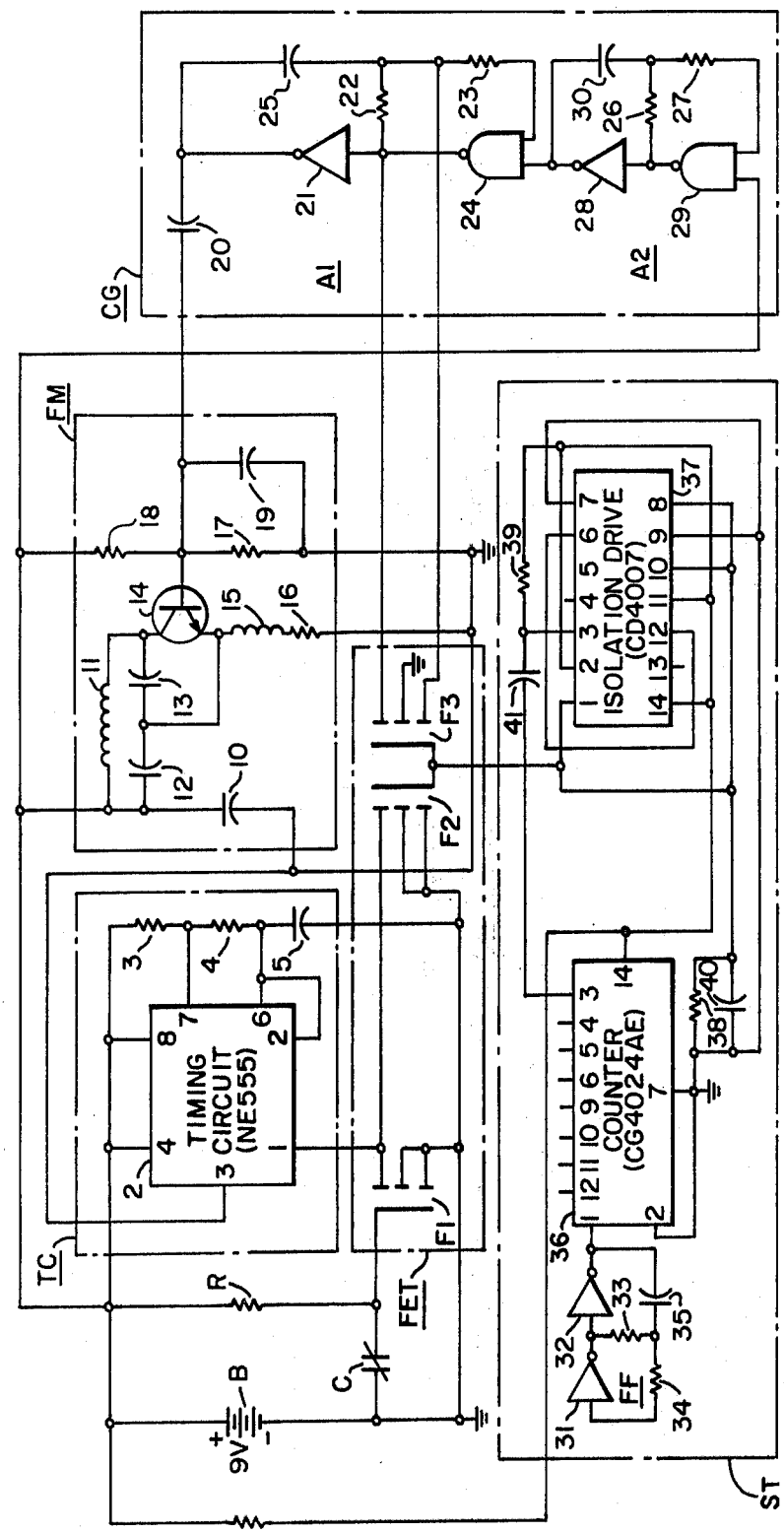
FIG. 4
FIG. 5
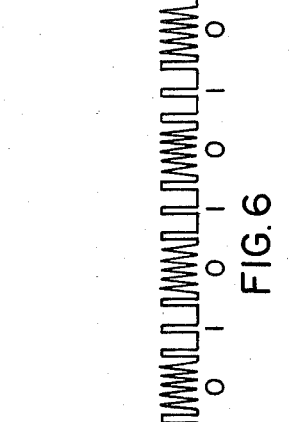
FIG. 6

BATTERY OPERATED TRANSMITTER CIRCUIT

BACKGROUND OF THE INVENTION

The existence of a market for wireless alarm systems has produced numerous design concepts, with and without batteries. The design concepts based on the use of batteries have suffered due to the limited life of available batteries which adversely affects the reliability of the alarm systems. The mechanical alarm systems designed to operate without the use of batteries, typically storing energy by mechanical means which are triggered by the disturbance of a monitored object i.e. a door or window, have suffered from such disadvantages as "one shot" operation thereby lacking the capability to repeatedly transmit alarm conditions. While both the battery and non-battery alarm systems exhibit operational limitations, the non-battery systems are generally preferred inasmuch as a battery system is considered to have a higher probability of failure.

The following disclosure is directed to a battery operated RF alarm circuit which overcomes the shortcomings of conventional battery operated circuits and provides for continuous supervision of the operational integrity of the alarm circuit.

SUMMARY OF THE INVENTION

There is disclosed herein with reference to the accompanying drawings a battery operated radio frequency alarm circuit designed to provide for self-checking of battery condition and circuit failure on regular intervals, as well as transmitting unique tone code signals which provide for indication of alarm conditions as well as alarm circuit operating status.

A local RF receiver circuit responds to the uniquely coded signals from one or more alarm transmitting circuits by decoding the received signals and communicating information as to the alarm state or operational integrity of the alarm circuit to a remote monitoring system.

DESCRIPTION OF THE DRAWINGS

The invention will become more readily apparent from the following exemplary description in connection with the accompanying drawings:

FIG. 4 is a detailed schematic illustration of a typical embodiment of the alarm circuit of FIG. 2;

FIG. 5 is a block diagram illustration of a typical embodiment of the local receiver circuit of the wireless alarm system of FIG. 1; and FIG. 6 is a waveform illustration of an alternate tone code pattern.

DESCRIPTION OF THE PREFERRED EMBODIMENT

Figure 1:
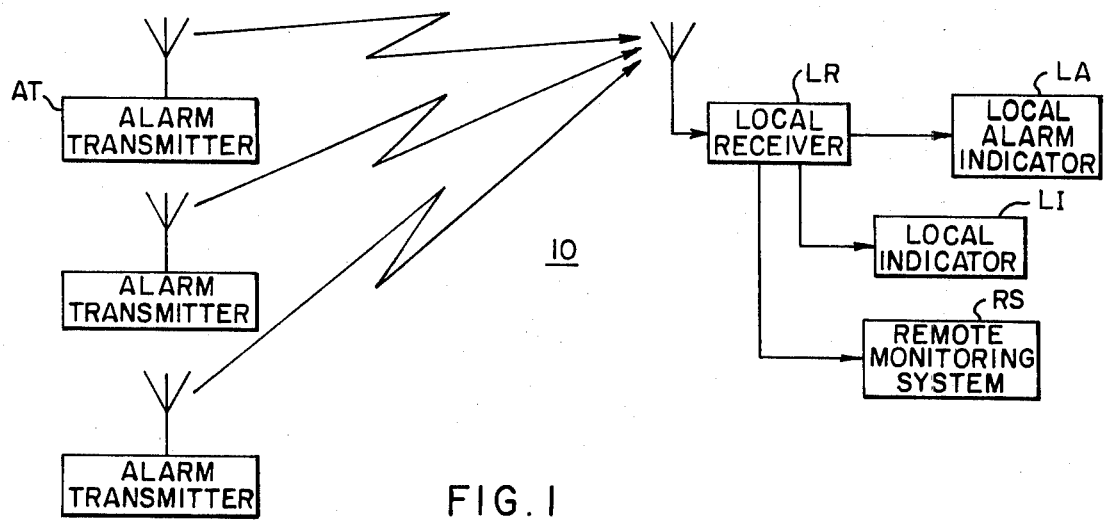
FIG. 1 is a block diagram illustration of a wireless alarm system.

There is illustrated in FIG. 1 a block diagram schematic illustration of wireless alarm system 10 comprising one or more battery operated RF alarm circuits AT capable of transmitting distinct signals indicative of the operational integrity of the circuit AT and an alarm condition, a local receiver circuit LR for receiving the transmitted signals from the alarm circuits AT and acknowledging a valid alarm condition by activating local alarm indicator LA and transmitting the alarm condition information to a remote monitoring system RS. The alarm circuits AT may take the form of intrusion and fire detection circuits mounted at various points in a facility with a single local receiver circuit LR assigned to the facility. The system 10 may consist of numerous facilities, each including a separate local receiver circuit LR and corresponding alarm circuits AT, with the remote monitoring system RS responding to the output signals from the various local receiver circuits LR to initiate appropriate responses to the alarm conditions.

An alternative embodiment of the alarm circuits AT could be that of a device carried by personnel and capable of being manually actuated. Such a device could be incorporated in a wrist watch type package worn by security personnel, bank employees, etc. and upon manual actuation would transmit a radio frequency signal to a local receiver circuit LR.

The transmission frequency for the alarm circuit could be any one of numerous radio frequencies approved by the Federal Communications Commission.

Figure 2:
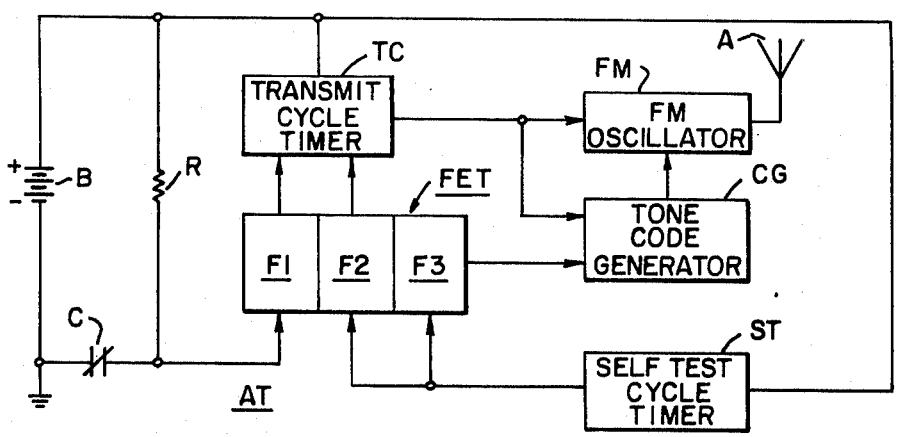
FIG. 2 is a block diagram illustration of an alarm circuit included in the system of FIG. 1.

A block diagram illustration of one technique for implementing the operation of the alarm circuit AT is illustrated in FIG. 2. While numerous techniques, digital and non-digital, are available for implementing the alarm circuit concept disclosed herein, the simplified embodiment illustrated in FIGS. 2 and 4 provide a basis for a clear understanding of the alarm circuit concept.

In the embodiment of FIG. 2, the alarm sensing device is represented by normally closed contacts C which, in the event of an alarm condition, i.e. intrusion, will open. In the non-alarm state, the battery B is connected in series with load resistor R through the normally closed contacts C and as such the battery B is required to supply current only to the resistor R of the alarm circuit AT thus minimizing battery current gain during the non-alarm condition.

In the event of an alarm condition, resulting in the opening of the normally closed contact C, the first stage F1 of a three stage field effect transistor FET, which functions as a high impedance switch, activates transmit cycle timer TC which in turn periodically activates oscillator FM and tone code generator CG. The three stage field effect transistor FET is merely a combination of three conventional independently operated field effect transistors F1, F2 and F3. In alarm condition, the tone code generator CG functions to frequency modulate the output of the oscillator, FM, waveform A of FIG. 3, to produce an encoded alarm tone illustrated as waveform B of FIG. 3 which is subsequently transmitted by an antenna A to the local receiver circuit LR of FIG. 1. The transmit cycle timer circuit TC determines the duration of the transmitted alarm tone as well as the rate at which the alarm tone is repeatedly transmitted.

Figure 3:
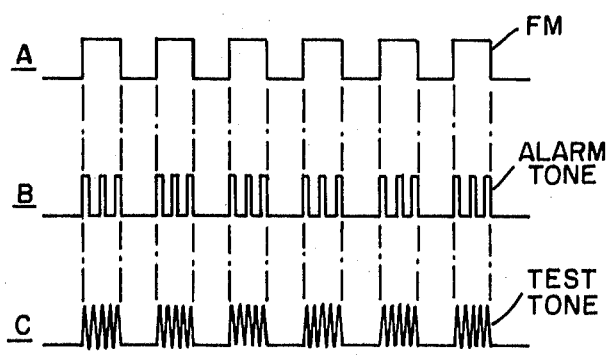
FIG. 3 is a waveform illustration of the codes generated by the alarm circuit of FIG. 2.

In addition to transmitting an alarm tone, the alarm transmitter circuit AT periodically transmits a circuit test tone, illustrated as waveform C of FIG. 3, in response self-test cycle timer circuit ST to communicate the operational status of the alarm circuit AT to the local receiver circuit LR. On a periodic basis, the self-test cycle timer circuit ST applies a signal to the second stage F2 of the field effect transistor FET to cause transmit cycle timer circuit TC to activate oscillator circuit FM. Simultaneously, self-test cycle timer circuit ST supplies a signal to the third stage F3 of the field effect transistor FET causing tone code generator CG to frequency modulate the output of the oscillator circuit FM to produce a unique test tone similar to that illustrated as waveform C of FIG. 3. The test tone is transmitted by antenna A to the local receiver LR which through suitable input filtering distinguishes the test tone from an alarm tone and provides an output signal to the remote monitoring system RS acknowledging the transmission of the test tone. The absence of the transmission of a test tone can be used to activate a local indicator LI to alert personnel of an inoperative alarm circuit. The self-test mode of operation provides an effective technique for determining not only the status of the battery B but all other components in the alarm circuit AT with the possible exception of a first stage F1 of the field effect transistor FET. It is apparent that numerous combinations of clearly distinguishable tones can be used to differentiate the alarm tone from the test tone and that the illustrations of waveforms B and C of FIG. 3 are merely typical. Further, it is apparent that digital techniques can be employed wherein tone code patterns could be generated in response to predetermined patterns of logic "1's" and "0's" such as that illustrated in FIG. 6.

A detail implementation of the alarm circuit of FIG. 2 is illustrated in FIG. 4 employing commercially available circuit components. The transmit cycle timer circuit TC is illustrated as consisting of timing circuit 2 having drive inputs from the first stage F1 and the second stage F2 of the field effect transistor FET and supplying output voltage levels to the oscillator circuit FM in response to the on-off timing cycle established by resistors 3 and 4 and capacitor 5. The operation of the timing circuit 2 can be satisfied through use of commercially available timing circuit model NE555. The output from the timing circuit 2 alternates from a high voltage level corresponding to the peak battery voltage, i.e. 9 volts, to a lower voltage level in response to a drive input from either stage F1 or stage F2 of the field effect transistor FET. With the output of the timing circuit 2 at the low voltage level, the bias voltage appearing across resistors 16, 17 and 18 of the oscillator circuit FM bias the transistor 14 to cause it to oscillate at an RF frequency determined by the combination of inductor 11 and capacitors 12 and 13. Capacitors 10 and 19 provide the required RF ground return while the inductor 15 functions as an RF blocking choke.

The frequency modulation of the RF signal developed by the oscillator circuit FM to produce the alarm tone in response to the opening of the contacts C is determined by the combined operation of a high frequency astable oscillator A1 and a lower frequency astable oscillator circuit A2. Astable oscillator circuit A1 consists of NOR gate 21, NAND gate 24, resistors 22 and 23 and capacitor 25 while astable oscillator circuit A2 consists of resistors 26, 27, NOR gate 28, NAND gate 29 and capacitor 30. Astable oscillator A1 is designed to operate at a higher frequency than astable oscillator A2 such that the conduction of stage F3 of the field effect transistor FET will cause astable oscillator A2 to periodically gate astable oscillator A1 in an on-/off manner to produce a train of modulation pulses which modulate the waveform developed by the oscillator circuit FM to produce the alarm tone illustrated as waveform B of FIG. 3.

Thus, the opening of the contacts C produce a periodic oscillator output of the type illustrated as waveform A of FIG. 3 from the oscillator circuit FM which is frequency modulated by the output of the tone code generator circuit CG to produce a distinct alarm tone as indicated by waveform B of FIG. 3.

Periodic testing of the operational integrity of the circuit components comprising the alarm circuit AT is achieved by a periodic conduction of stages F2 and F3 of the field effect transistor FET initiated by the output of the self-test cycle timer circuit ST. A flip-flop type circuit FF consisting of NOR gates 31 and 32, resistors 33 and 34 and capacitor 35 form a low frequency astable oscillator having a period chosen to be approximately ½ second. Flip-flop circuit FF developes an output which is subsequently divided by a seven stage binary counter 36 to develop an "ON" or "HIGH" output of a 30 second duration at 1 hour intervals. The seven stage counter 36 can be implemented through the use of commercially available RCA counter circuit type CG 4024 AE. While the output from the counter circuit 36 may be applied directly to stages F2 and F3 of the field effect transistor FET to render such stages conductive, in the embodiment illustrated in FIG. 4 the output from the counter stage 36 is coupled through an FET isolation drive circuit 37 and associated components resistors 38 and 39 and capacitors 40 and 41 to the stages F2 and F3. The implementation of the optional isolation drive circuit 37 may be satisfied through the use of RCA circuit type CD4007.

The conduction of stage F2 initiated by the self-test cycle timer circuit ST activates transmit cycle timer circuit TC to produce the oscillator output from the oscillator circuit FM as described above. The conduction of stage F3 produced by the output from the self-test timer circuit ST activates the tone code generator circuit CG to modulate the output waveform of the FM oscillator circuit FM but in so doing shunts the resistor 22 of the astable oscillator circuit A1 thus resulting in a modulation frequency output from the tone code generator CG which differs from that developed in response to an alarm condition. The shunting of the resistor 22 causes the tone code generator CG to modulate the signal developed by the oscillator circuit FM at a higher frequency than that associated with an alarm condition thus producing a test tone pattern, of the type illustrated as waveform C of FIG. 3 which exhibits tone characteristics for the circuit test condition which is clearly distinguishable from the tone characteristics of the alarm tone produced in response to opening of the contacts C.

In accordance with the operation of the alarm circuit AT as described above, wherein separate and distinct tones are developed to identify alarm and circuit operating conditions, the reliability of the battery operated circuit AT is significantly enhanced inasmuch as minimal current is drawn from the battery B during standby i.e. non-alarm and non-test conditions. Only during the limited periods when alarm tones and test tones are transmitted is the battery B required to supply significant power. Typically, a 1 ampere hour, 9 volt battery provides satisfactory operation for periods in excess of 6 months.

The local receiver circuit LR of FIG. 1 is designed to include narrow pass input filters responsive to the unique alarm and test tone patterns developed by each of the alarm circuits AT and to acknowledge the validity of the transmitted tones both on the basis of frequency and duration so as to minimize false alarms.

A typical embodiment of the local receiver circuit LR is illustrated in FIG. 5 as including a conventional FM receiver 50 and an audio amplifier 52 which function to recover the audio modulation of the RF carrier to which the alarm circuits AT are tuned. The audio output from audio amplifier 52 is simultaneously applied to plurality of tone selector channels 60 each of which is designed to respond to one of the alarm circuits AT. Each tone selector channel 60 includes a tone filter 62 which is responsive to the transmitted signals of one of the alarm circuits AT. The output of the tone filter 62 is rectified by rectifier circuit 64 and applied to actuate the alarm indicator circuit 66 which may represent one section of the local alarm indicator LA.

What is claimed is:

1. A battery operated RF transmitter circuit, comprising:
    a battery,
    an ON-OFF condition responsive device for connecting said battery through a high impedance means when said ON-OFF condition responsive device is in an OFF state to provide minimum current drain from said battery,
    transmitter circuit means including:
    a cycle timer means,
    first switch means responsive to the ON state of said ON-OFF condition responsive device for activating said cycle timer means to connect said battery to said transmitter circuit means,
    RF oscillator means connected to said cycle timer means, said cycle timer means periodically activating said RF oscillator means to produce an RF output waveform,
    tone code generator means connected to said RF oscillator means and responsive to the ON state of said ON-OFF condition responses means to frequency modulate said RF output to transmit a first predetermined tone indicative of the ON state of said ON-OFF condition responsive device,
    self-test circuit means,
    second switch means connected between said self-test circuit means and said cycle timer means to periodically activate said cycle timer means in response to said self-test circuit means to connect said battery to said transmitter circuit means and activate said RF oscillator means to produce an RF output signal, the activation of said cycle timer means by said second switch means further activating said tone code generator means to frequency modulate said RF output at a frequency to transmit a second predetermined tone distinct from said first predetermined tone and indicative of a circuit test signal, said cycle timer means determining the duration and repetition rate of said first and second predetermined tones.

2. A battery operated RF transmitter circuit as claimed in claim 1 wherein said tone code generator means includes a first and second astable oscillator circuit to produce said first predetermined tone, and third oscillator circuit means operating to produce said second predetermined tone.

3. A battery operated RF transmitter circuit as claimed in claim 1 wherein said self-test circuit means includes control means for periodically activating said second switch means to transmit said second predetermined tone on a periodic basis.

4. A security system comprising, a plurality of RF signal producing alarm circuits wherein each alarm circuit includes:
    a battery,
    an ON-OFF condition responsive device for connecting said battery through a high impedance means when said ON-OFF condition responsive device is in an OFF state to provide minimum current gain from said battery,
    transmitter circuit means including:
    a cycle timer means,
    first switch means responsive to the ON state of said ON-OFF condition responsive device for activating said cycle timer means to connect said battery to said transmitter circuit means,
    RF oscillator means connected to said cycle timer means, said cycle timer means periodically activating said RF oscillator means to produce an RF output waveform,
    tone code generator means connected to said RF oscillator means and responsive to the ON state of said ON-OFF condition responses means to frequency modulate said RF output to transmit a first predetermined tone indicative of the ON state of said ON-OFF condition responsive device,
    self-test circuit means,
    second switch means connected between said self-test circuit means and said cycle timer means to periodically activate said cycle timer means in response to said self-test circuit means to connect said battery to said transmitter circuit means and activate said RF oscillator means to produce an RF output signal, the activation of said cycle timer means by said second switch means further activating said tone code generator means to frequency modulate said RF output at a frequency to transmit a second predetermined tone distinct from said first predetermined tone and indicative of a circuit test signal,
    said first and second predetermined tones of the respective alarm circuits being different, and
    receiver circuit means for receiving and distinguishing the transmitted first and second predetermined tones of the respective alarm circuits.

* * * * *